United States Patent [19]
Lee et al.

[11] Patent Number: 6,018,487
[45] Date of Patent: Jan. 25, 2000

[54] READ-ONLY MEMORY DEVICE HAVING BIT LINE DISCHARGE CIRCUITRY AND METHOD OF READING DATA FROM THE SAME

[75] Inventors: June Lee, Seoul; Heung-Soo Im, Kyunggi-do, both of Rep. of Korea

[73] Assignee: Samsung Electronics Co., Ltd., Rep. of Korea

[21] Appl. No.: 09/213,721

[22] Filed: Dec. 17, 1998

[30] Foreign Application Priority Data

Dec. 31, 1997 [KR] Rep. of Korea .................. 97-80999

[51] Int. Cl.[7] ........................................ G11C 7/00
[52] U.S. Cl. .................. 365/204; 365/104; 365/185.25; 365/94
[58] Field of Search .......................... 365/204, 203, 365/94, 103, 104, 185.25

[56] References Cited

U.S. PATENT DOCUMENTS

| | | | |
|---|---|---|---|
| 4,797,857 | 1/1989 | Schreck et al. ............... | 365/104 |
| 4,951,255 | 8/1990 | Hobbs ......................... | 375/204 |
| 5,278,795 | 1/1994 | Barbu et al. .................. | 365/204 |
| 5,453,955 | 9/1995 | Sakui et al. .................. | 365/204 |
| 5,627,788 | 5/1997 | Chang et al. ................. | 365/204 |
| 5,703,809 | 12/1997 | Hull et al. ................... | 365/204 |
| 5,703,820 | 12/1997 | Kohno ......................... | 365/185.25 |
| 5,751,657 | 5/1998 | Hotta .......................... | 365/104 |
| 5,926,426 | 7/1999 | Morimoto .................... | 365/104 |

*Primary Examiner*—Tan T. Nguyen
*Attorney, Agent, or Firm*—Myers Bigel Sibley & Sajovec

[57] ABSTRACT

A mask ROM of the invention discharges bit lines selectively before a bit line precharge operation in response to an externally applied command. A column decoder selects one of bit lines in response to column select signals. A discharge control circuit generates a first discharge control signal in response to the command. A discharge predecoder generates a plurality of second discharge control signals by logically combining the first discharge control signal with the column select signals. A bit line discharge circuit selectively discharges the bit lines in response to the second discharge control signals. The mask ROM is free from bit line coupling due to the selection of particular memory cells, the cell selection sequence and the programmed states of the selected cells, leading to an improvement in read speed.

20 Claims, 14 Drawing Sheets

6,018,487

1

READ-ONLY MEMORY DEVICE HAVING BIT LINE DISCHARGE CIRCUITRY AND METHOD OF READING DATA FROM THE SAME

FIELD OF THE INVENTION

The present invention relates to read-only memory (ROM) devices and, more particularly, to mask ROMs in which programs are written during their manufacturing process. The present invention further relates to a method of reading data out of such ROMs.

The present invention is based on Korean Patent Application Ser. No. 80999/1997 which is incorporated herein by reference for all purpose.

BACKGROUND OF THE INVENTION

FIG. 1 schematically illustrates a memory cell array of a conventional ROM, and FIG. 2 is a timing diagram for read operation of the mask ROM of FIG. 1. In FIG. 1, reference symbols MC1–MC5 represent memory cells, BL(i−1) to BL(i+1) bit lines, WL(0) through WL(m) word lines, and YA(0) through YA(15) and YB(0) through YB(3) column select lines (or column select signals). Column select transistors controlled by the column select signals YA(0) to YB(3) select one of the bit lines. The selected bit line is electrically coupled to a sense amplifier circuit and thereby a data bit on the selected bit line can be sensed and amplified.

A read operation of a ROM is typically divided into three periods: bit line precharge, data sensing, and data output periods. At the beginning of the data read operation (i.e., the precharge period), all the bit lines is precharged to a predetermined voltage (e.g., 1 V to 2 V) in order to enhance the sensing gain and increase the data sensing speed. Thereafter, the voltage level on the selected bit line coupled with a selected memory cell is sensed and it is determined whether the selected cell is an "on-cell" that presents a current path between a corresponding bit line and a voltage supply of a reference voltage (e.g., ground voltage), or "off-cell" doing no current path between them. It is commonly assumed that the on-cell is programmed to a logic "0" and the off-cell a logic "1". Lastly, the sensed data is output to exterior.

During such a read operation of the prior art ROM, however, there is a possibility that reading errors will occur, depending on the selection of particular cells, the cell selection sequence and the programmed states of the selected cells. An example of the reading error mechanism will be explained with reference to FIGS. 1 and 2 below.

Referring again to FIG. 1, the memory cells MC1–MC3 are assumed on-cells and the other cells MC4 and MC5 off-cells. As shown in FIG. 2, it is also assumed that cells MC1–MC3 are selected in the read cycles I, II and III in order, respectively. No error occurs in cycles I and II associated with reading cells MC1 and MC2. During the cycles I and II in which word line WL(i) and column select lines YA(0), YA(2) and YB(1) are selected, the bit lines BL(i−1) and BL(i+1) are maintained at their precharge levels since the cells MC1 and MC2 are off-cells. In order to read a data from the cell MC3 in cycle III, when word line WL(j) and column select lines YA(1) and YB(1) are activated and bit line BL(i) is precharged, the bit lines BL(i−1) and BL(i+1) begin to discharge since cells MC4 and MC5 are on-cells, causing the capacitive coupling between bit lines BL(i−1), BL(i) and BL(i+1). This bit line coupling effect is more serious if at least one of the cells MC4 and MC5 has a current driving capability larger than that of a

2 normal on-cell, i.e., if either or both of the cells MC4 are "best on-cells". The bit line coupling prevents the bit line BL(i) from being precharged sufficiently. Therefore, when the off-cell MC3 coupled to the bit line BL(i) under-precharged is sensed, the voltage on the bit line BL(i) cannot be amplified up to an appropriate level by a sense amplifier during a given sensing time, leading to a delay in the data sensing or a reading error that the cell MC3 is identified as an on-cell.

As is clear from the above discussion, there exists a need for a mask ROM device and method for solving the bit line coupling problem to improve read speed and prevent read fail.

SUMMARY OF THE INVENTION

It is an object of the present invention to provide ROMs free from bit line coupling.

It is another object of the present invention to provide ROMs having an increased read speed.

It is still another object of the present invention to provide ROMs capable of precharging bit lines thereof sufficiently to reduce reading errors.

It is still another object of the present invention to provide a method for reading data from ROMs stably.

These and other objects, advantages and features of the present invention are provided by read-only memories (ROMs) which include a column discharge circuit which discharges columns of bit lines selectively before a column precharge operation in response to an externally applied command. The preferred column discharge circuit includes a first circuit which selects one of the columns in response to column select signals, a second circuit which generates a first discharge control signal (for example, RDIS, or CDIS) in response to the externally applied command, a third circuit which generates a plurality of second discharge control signals (e.g., RDIS_$\overline{YA}$, or CDIS_$\overline{YA}$) by logically combining the first discharge control signal with the column select signals, and a fourth circuit which discharges the columns selectively in response to the second discharge control signals. The command, such as a read command, is represented by a logical combination of an externally applied chip select signal and the row and column address strobe signals. The first discharge control signal can be activated in synchronism with a row address strobe signal. The second discharge control signals all are activated in response to the first discharge control signal such that all the columns are discharged. Alternatively, the first discharge control signal can be activated in synchronism with a column address strobe signal. In this case, all the second discharge control signals are also activated in response to the first discharge control signal such that all the columns are discharged before the column precharge operation.

According to a preferred aspect of the present invention, synchronous burst mask ROM devices are provided. This memory devices are applied with an external row address and an external column address synchronized with row and column address strobe signals, respectively. Also, the memory devices generate a plurality of internal column addresses sequentially in response to the external column address. Each of the memory devices comprises an array of a plurality of memory cells each coupled to a corresponding one of word lines and to a corresponding one of bit lines, a column predecoder, a column decoder, and a sense amplifier. The column predecoder generates a plurality of first column select signals (e.g., YA) and a plurality of second column select signals (e.g., YB) in response to the external column address. The column decoder selects one of the bit lines in response to the first column select signals and couples the selected bit line to a data line in response to the second column select signals. The sense amplifier senses and amplifies a data bit on the data line. Each memory device further includes a discharge control circuit, a discharge predecoder, and a bit line discharge circuit. The discharge control circuit generates a first discharge control signal (e.g., RDIS, or CDIS) in response to an externally applied command. The discharge predecoder generates a plurality of second discharge control signals (e.g., RDIS_$\overline{YA}$, or CDIS_$\overline{YA}$) by logically combining the first discharge control signal with the first column select signals. The second discharge control signals are preferably generated, for example, by logically ORing the first discharge signal and a complement of the second control signals, so that unselected columns are discharged before the column precharge operation. The bit line discharge circuit discharges the bit lines selectively in response to the second discharge control signals before a bit line precharge operation. In addition, each of the memory devices includes a circuit for generating a third discharge control signal (e.g., φDIS) in response to the command and a circuit for discharging the data line in response to the third discharge control signal. The third discharge control signal is preferably activated in synchronism with the internal column addresses. Further, at least one dummy cell, a dummy data line coupled to the at least one dummy cell, and a circuit for discharging the dummy data line in response to the third discharge control signal can be provided for the respective memory devices.

According to another preferred aspect of the present invention, a method for reading data out of ROMs is provided. The method comprises discharging all bit lines in synchronism with a row address strobe signal, precharging a selected bit line, and sensing a data bit on the selected bit line. Moreover, unselected bit lines can be discharged in synchronism with one of the internal column addresses just before precharging the selected bit line.

As described above, according to the present invention, ROMs are free from bit line coupling due to the selection of particular memory cells, the cell selection sequence and the programmed states of the selected cells, leading to an improvement in read speed.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. In the following description of the preferred embodiments of the present invention, data stored in a memory cell is accessed in synchronism with a system clock signal CLK which operates as a reference clock signal. Further, the preferred embodiments of the present invention will be discussed with reference only to synchronous burst NAND type mask ROM environments, for the sake of simplicity. It should be noted, however, that the present invention is applicable to synchronous NOR structured mask ROMs, or to other high density, high speed synchronous NAND or NOR type ROMs such as EPROMs, or flash EEPROMs. Also, the invention is applicable to asynchronous ROMs.

Figure 1:
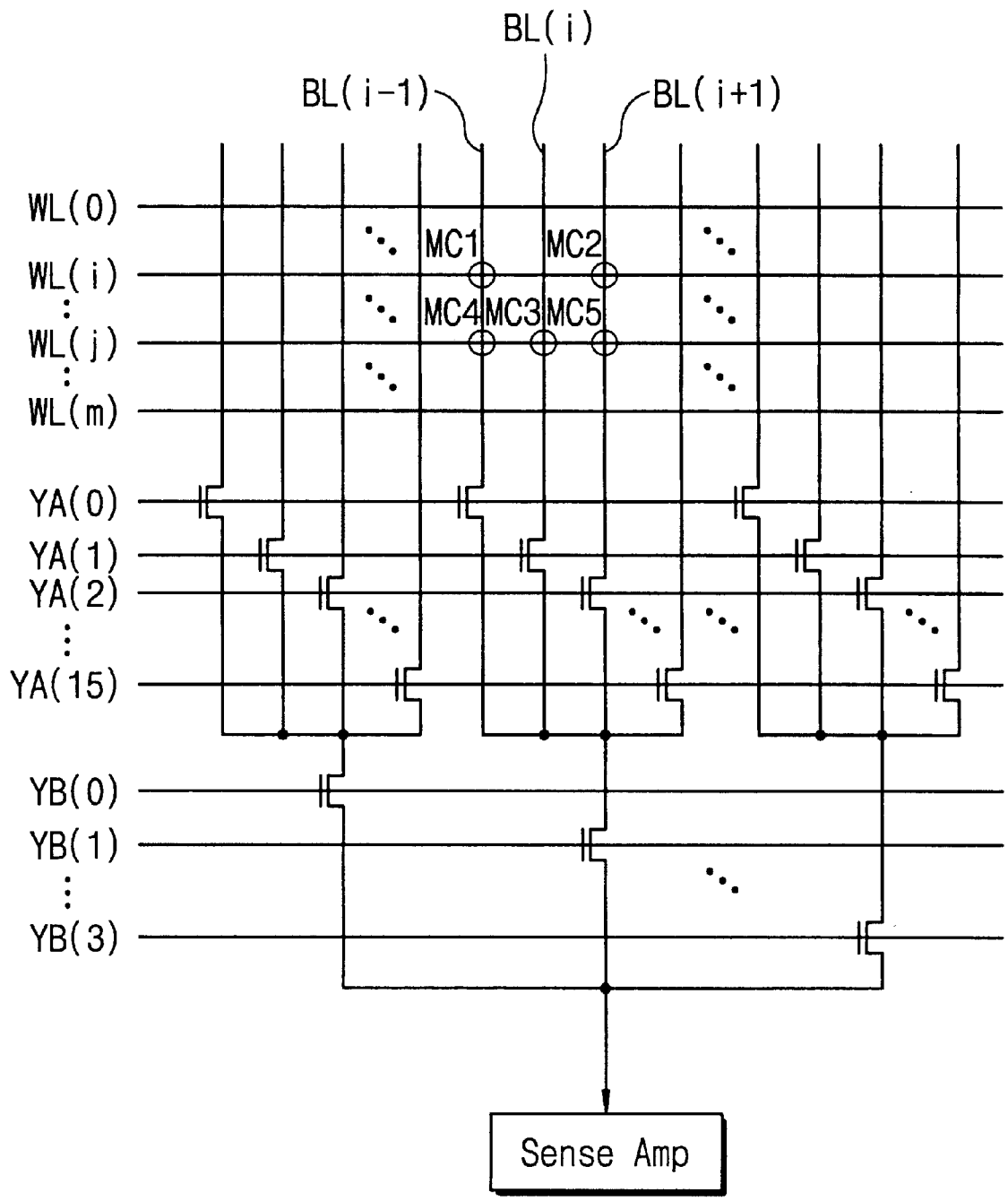
FIG. 1 is a schematic circuit diagram of a memory cell array of a conventional read-only memory (ROM)
Figure 2:
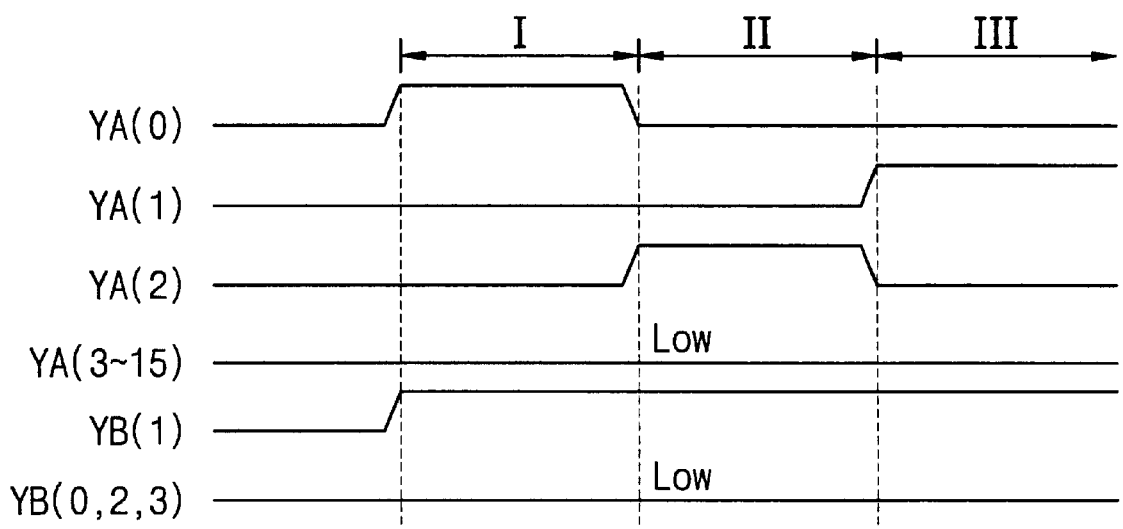
FIG. 2 is a timing diagram for read operation of the ROM of FIG. 1.
Figure 3:
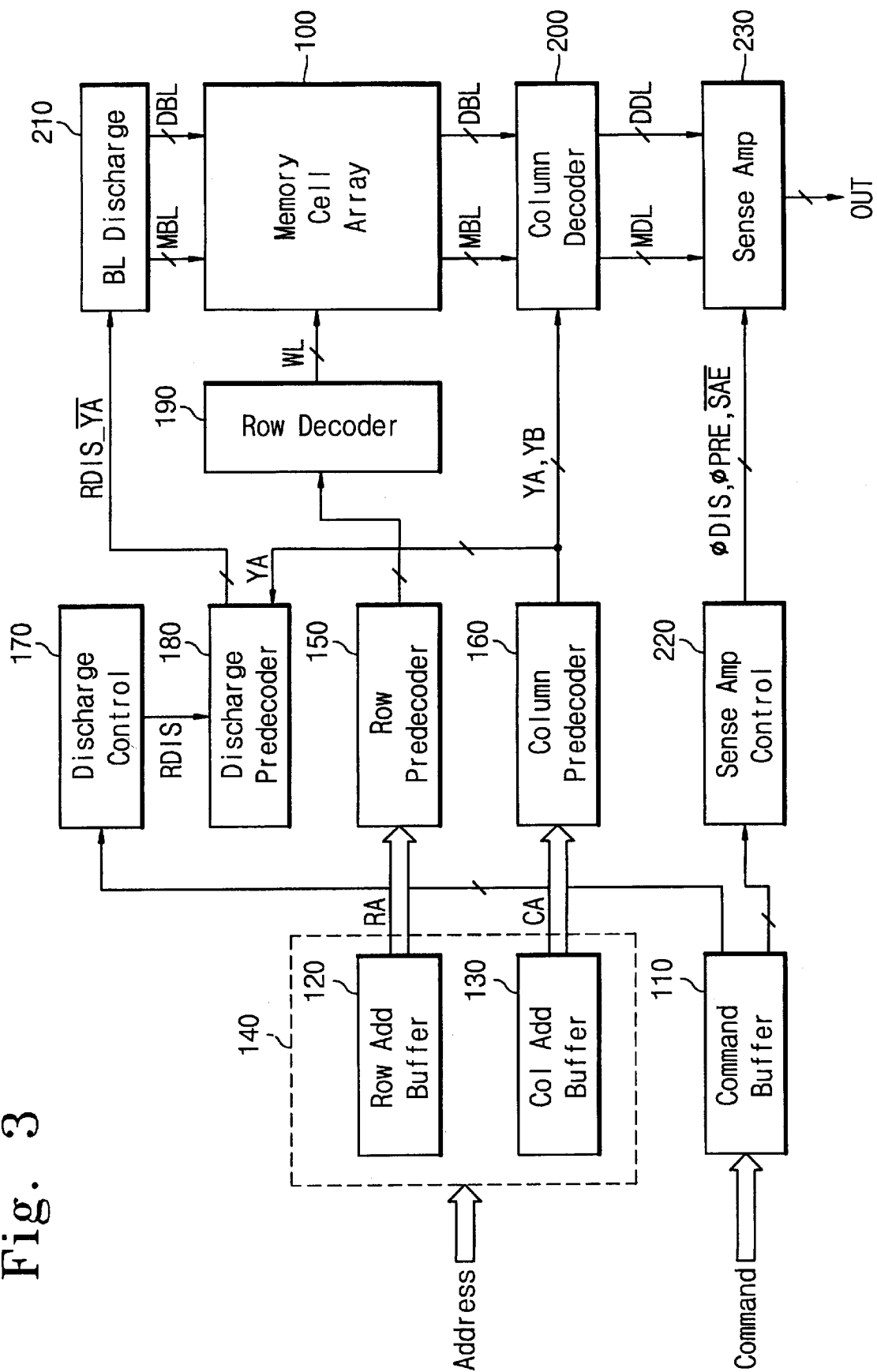
FIG. 3 is a block diagram illustrating an embodiment of a ROM according to the present invention.

FIG. 3 illustrates a synchronous burst mask ROM according to an embodiment of the present invention. Referring to FIG. 3, the ROM includes an array 100 of a plurality of memory cells (not shown). The memory cell array 100 is assumed NAND structured array having a plurality of cell strings. A command is externally applied to a discharge control circuit 170 and to a sense amp control circuit 220 through a command buffer 1 10. An address buffer 140 is provided with external addresses, i.e., a row address RA and a column address CA which are buffered by row and column address buffers 120 and 130, respectively. The row address RA is fed to a row decoder 190 via a row predecoder 150. The row decoder 190 selects one of word lines WL. The column address CA is predecoder by a column predecoder 160. The column predecoder generates a plurality of first column select signals YA and a plurality of second column select signals YB.

A column decoder 200 selects main bit lines MBL (i.e., columns) which correspond to a predetermined burst length in response to the first and second column select signals YA and YB. A discharge control circuit 170 generates a discharge control signal RDIS in response to an externally applied command. The discharge control signal RDIS is provided to a discharge predecoder 180. This predecoder 180 is also supplied with the first column select signals YA. The discharge predecoder 180 generates a plurality of second discharge control signals RDIS_$\overline{YA}$ by logically combining the first discharge control signal RDIS with the first column select signals YA. The second discharge control signals RDIS_$\overline{YA}$ are applied to a bit line discharge circuit 210 which selectively discharge the main bit lines MBL in response to the second discharge control signals RDIS_$\overline{YA}$.

Data bits on the selected bit lines MBL are provided through the column decoder 200 to a sense amplifier circuit 230. The sense amplifier circuit controlled by a sense amp control circuit 220 which generates a third discharge control signal φDIS, a precharge control signal φPRE and a sense amp enable signal $\overline{SAE}$, which will be described in detail later.

Although not shown in FIG. 3, it should be noted that the mask ROM further includes an internal clock buffer circuit, a data latch circuit, a data output buffer, and several burst read control circuits such as a mode register, a burst controller, a burst counter (i.e., an internal column address generator) and a burst address decoder, which are well known to those skilled in the art and thus their detailed description will be omitted herein for a concise explanation and in order to avoid unnecessarily obscuring the present invention.

Figure 4:
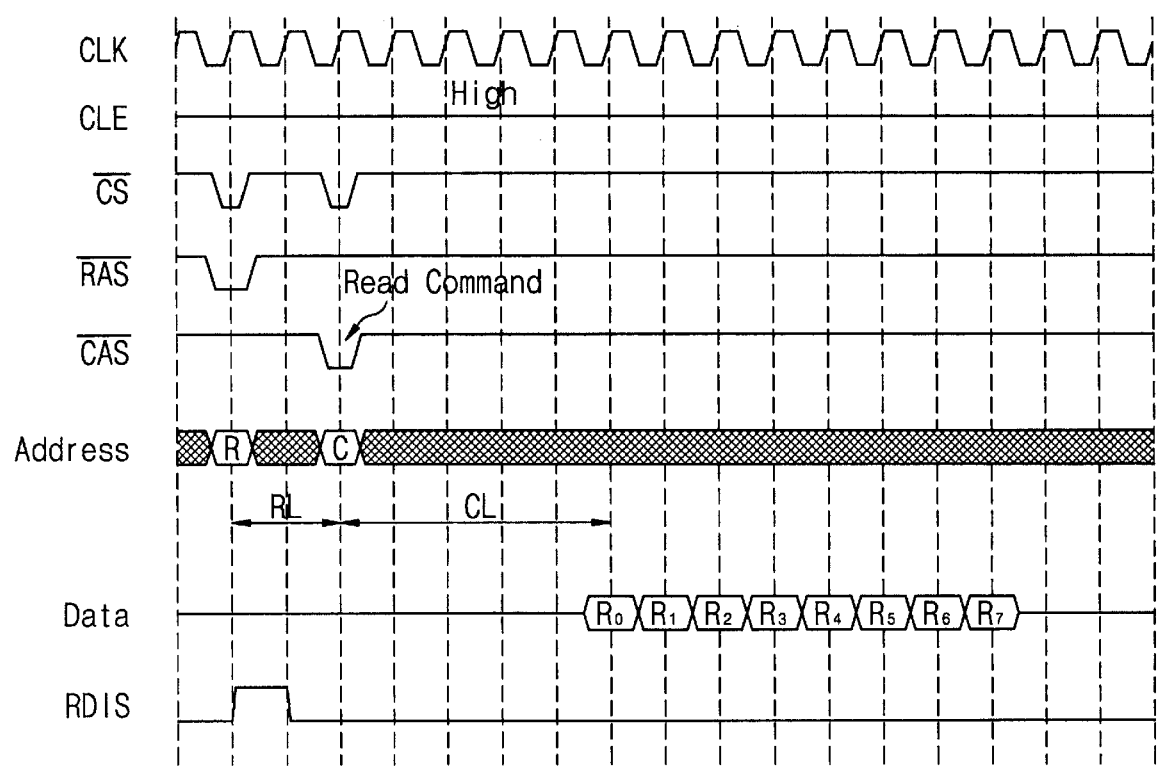
FIG. 4 is a timing diagram for a read operation of the ROM of FIG. 3.

Reference is now made to FIG. 4, which is a timing diagram for a read operation of the synchronous burst ROM of FIG. 3. As shown, system clock CLK is effective while a clock enable signal CLE is active high. A chip select signal $\overline{CS}$, a row address strobe signal $\overline{RAS}$ and a column address strobe signal $\overline{CAS}$ are applied to the ROM externally. Row address R is input in synchronism with the chip select signal $\overline{CS}$ and the row address strobe signal $\overline{RAS}$. The activation of the first discharge control signal RDIS is also synchronized with the row address strobe signal $\overline{RAS}$. After a $\overline{RAS}$ latency RL of 2 has been elapsed, the column address C is input in synchronism with the chip select signal $\overline{CS}$ and the column address strobe signal $\overline{CAS}$. After a $\overline{CAS}$ latency of 5, data bits R0–R7 are output to exterior via the data latch and data output buffer (not shown).

Figure 5:
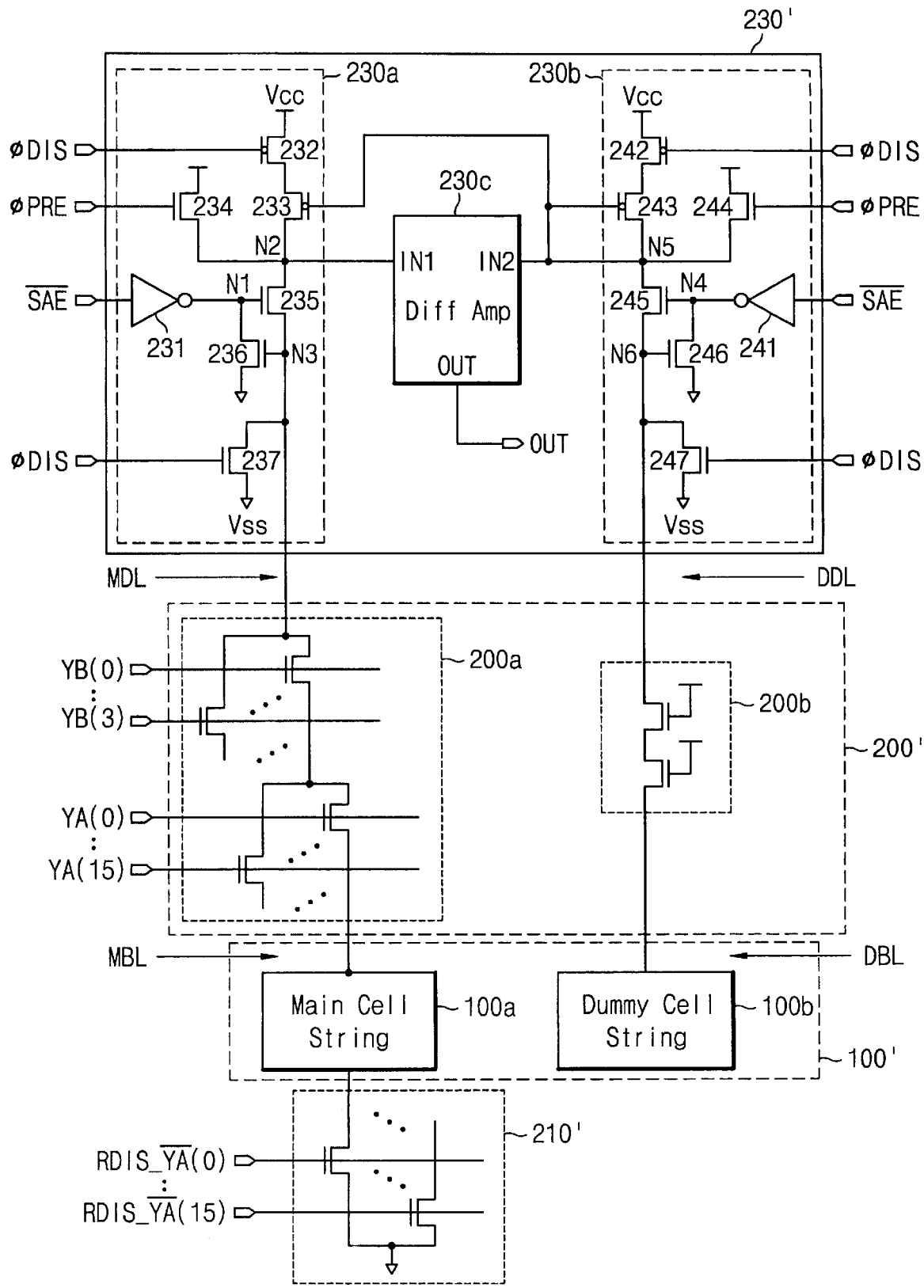
FIG. 5 is a detailed circuit diagram of the memory cell array, column decoder, bit line discharge circuit and sense amplifier shown in FIG. 3.

FIG. 5 is a detailed circuit diagram of the memory cell array 100, column decoder 200, bit line discharge circuit 210 and sense amplifier 230. The memory cell array 100 is divided into two sub-arrays, i.e., a main cell array and a dummy cell array, each of which consists of a plurality of cell strings. Main bit lines MBL run along columns on the main cell array. Similarly, dummy bit lines DBL run along columns on the dummy cell array. In FIG. 5, there are shown a unit circuit 230' of the sense amplifier 230 and its associated circuits 100', 200' and 210' only, for the simplicity of the illustration.

Referring to FIG. 5, sixty four bit lines MBL and a dummy bit line DBL correspond to a unit sense amplifier 230'. The sixty four main bit lines MBL correspond to sixty four main cell strings 100a and the one dummy bit line DBL a dummy cell 100b. The main bit lines MBL are coupled to a unit bit line discharge circuit 210' which selectively discharges the main bit lines MBL to a reference voltage, such as ground voltage, in response to the second discharge control signals RDIS_$\overline{YA}$(0) through RDIS_$\overline{YA}$(15).

A main column decoder circuit 200a selects one of the main bit lines MBL in response to the first and second column select signals YA0–YA15 and YB0–YB4. The selected bit line is electrically coupled to a main data line MDL which extends to the unit sense amplifier 230'. Dummy cell string 200b is coupled to a dummy data line DDL via a dummy column decoder circuit 200b having a loading equivalent to that of the main column decoder circuit 200a (i.e., having two transistors). The dummy data line DDL also extends to the unit sense amplifier circuit 230'.

The unit sense amplifier 230' includes a sensing voltage generation circuit 230a, a reference voltage generation circuit 230b, and a differential amplifier 230c. The sensing voltage generation circuit 230a is coupled between the main data line MDL and the differential amplifier 230c. Similarly, the reference voltage generation circuit 230b is coupled between the dummy data line DDL and the differential amplifier 230c. The sensing voltage generation circuit 230a generates a sensing voltage corresponding to the data state of a selected cell which has a current driving capability corresponding to its data state programmed. The reference voltage generation circuit 200b generates a reference voltage corresponding to the data state of a dummy cell conducting half the current of a worst on-cell. A selected cell has a current driving capability larger than that of a corresponding dummy cell (i.e., reference cell) when being an on-cell to store a logic "0" data, but it has a current driving capability smaller than that of the dummy cell when being an off-cell to store a logic "1" data. The differential amplifier 230c amplifies the difference between the reference voltage and the sensing voltage.

The sense amp enable signal $\overline{SAE}$ is applied to the input of a CMOS inverter 231 within the sensing voltage generation circuit 230a. This signal $\overline{SAE}$ is also applied to the input of an inverter 241 within the reference voltage generation circuit 230b. PMOS switch transistors 232 and 242 and current mirror type PMOS transistors 233 and 243 are provided for the sensing voltage generation circuit 230a and the reference voltage generation circuit 230b, respectively. Gates of the transistors 232 and 242 are fed with the third discharge control signal φDIS. The transistors 233 and 243 have their gates coupled to a node N5 coupled to an input terminal IN2 of the differential amplifier circuit 230c. Current paths of the transistors 232 and 233 are coupled in series between the power supply voltage Vcc and a node N2 coupled to the other input terminal IN1 of the differential amplifier circuit 230c, and those of the transistors 242 and 243 are coupled in series between the power supply voltage Vcc and the node N5. NMOS precharge transistors 234 and 244 are provided for the voltage generation circuits 230a and 230b, respectively. These transistors 234 and 244 has their gates applied with the precharge control signal φPRE. Current path of the transistor 234 is coupled between the power supply voltage Vcc and the node N2. The transistor 244 also has its current path coupled between the power supply voltage Vcc and the node N5. An NMOS transistor 235 has its current path coupled between the node N2 and the main data line MDL and its gate coupled to the output of the inverter 231 (i.e., node N1). Also, an NMOS transistor 245 is placed between the node N5 and the dummy data line DDL. Gate of the transistor 245 is coupled to the output of the inverter 241 (i.e., node N4). NMOS transistors 236 and 237 are further provided for the sensing voltage generation circuit 230a. The transistor 236 has its current path coupled between the node N1 and a ground voltage Vss and its gate coupled to the main data line MDL (i.e., node N3). Current path of the transistor 237 is coupled between the main data line MDL and the ground voltage Vss and its gate is applied with the third discharge control signal φDIS. Also, the reference voltage generation circuit 230b further includes NMOS transistors 246 and 247. Current path of the transistor 246 is coupled between the node N4 and the ground voltage Vss and gate thereof is coupled to the dummy data line (i.e., node N6). The transistor 247 has its current path coupled between the dummy data line DDL and the ground voltage and its gate applied with the third discharge control signal φDIS.

Figure 6:
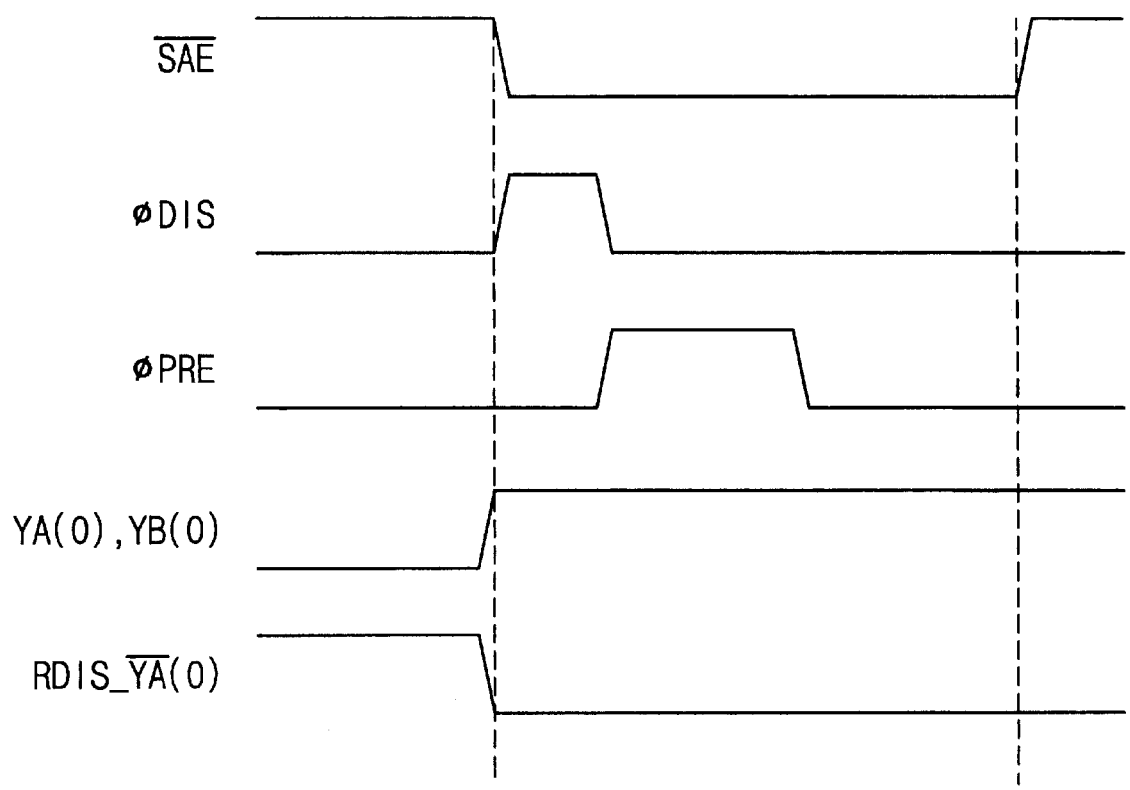
FIG. 6 is a timing diagram of the control signals on the circuits of FIG. 5.

FIG. 6 is a timing diagram illustrating the timing relationship between the control signals on the circuits of FIG. 5. With reference to FIGS. 5 and 6, a column of main bit line MBL is selected by activating the column select signals YA(0) and YB(0) in response to an external column address (i.e., an initial column address of burst mode). At this time, the sense amp enable signal $\overline{\text{SAE}}$ changes from a logic high level to a logic low level so that the sense amplifier 230' begins to be enabled. Also, the discharge control signal RDIS_$\overline{\text{YA}}$(0) is maintained at a low level while the other discharge control signals RDIS_$\overline{\text{YA}}$(1) through RDIS_$\overline{\text{YA}}$(15) remain high (not shown). This is the subject matter of the invention and will be described in detail later. At the same time, the discharge control signal φDIS becomes active high, but the mark length (or, pulse duration) of the signal φDIS is maintained only during a given proper time.

With the application of the low level signal $\overline{\text{SAE}}$, the voltage levels on the nodes N1 and N4 go high so as to make NMOS transistors 235 and 245 conductive. In response to the high level signal φDIS, the NMOS transistors 237 and 247 are turned on and the PMOS transistors 232 and 242 are turned off. The conduction of the transistors 237 and 247 has the data lines MDL and DDL discharged to the ground level Vss. This discharging enables the data lines MDL and DDL to have the same precharge response and allows the PMOS transistors 233 and 243 to be ready to conduct. The non-conduction of the transistors 232 and 242 prevents the occurrence of a short circuit between the power supply voltage Vcc and the ground voltage Vss, which causes a large amount of current flow.

When the above-described discharging has been finished, then the signal φDIS returns to the low level and the signal φPRE goes high. The transistors 237 and 247 are turned off and the transistors 232, 234, 242 and 244 on so that the voltage levels of the nodes N2, N3, N5 and N6 (i.e., data lines DDL and DL) increase rapidly. The increase of the voltage levels of the nodes N3 and N6 are stopped at a point that current driving capacities of the inverters 231 and 241 balance with those of the NMOS transistors 236 and 246.

After a given precharge period, the precharge control signal φPRE becomes inactive low again and so the transistors 234 and 244 are rendered off. At this time, the transistors 242 and 234 deliver the same amount of current as sinks to the ground voltage Vss via the dummy cell (i.e, reference cell) so as to maintain the voltage level of node N5 constant. This constant voltage is applied to the input IN2 of the differential amplifier 230c as a reference voltage. Owing to the current mirror arrangement, the transistors 232 and 233 conduct the same current as the transistors 242 and 234 do. As a result of this, if a selected memory cell is an on-cell, the sensing voltage level on node N2 becomes lower than the reference voltage level on the node N5 since the on-cell has a current driving ability greater than that of the dummy cell. On the contrary, when the selected cell is an off-cell, the sensing voltage of node N2 becomes higher than the reference voltage since the off-cell has a current driving ability smaller than that of dummy cell.

The voltage difference between the reference voltage and the sensing voltage is amplified by the differential amplifier 230c and output to external via data latch and data output buffer (not shown).

Figure 7:
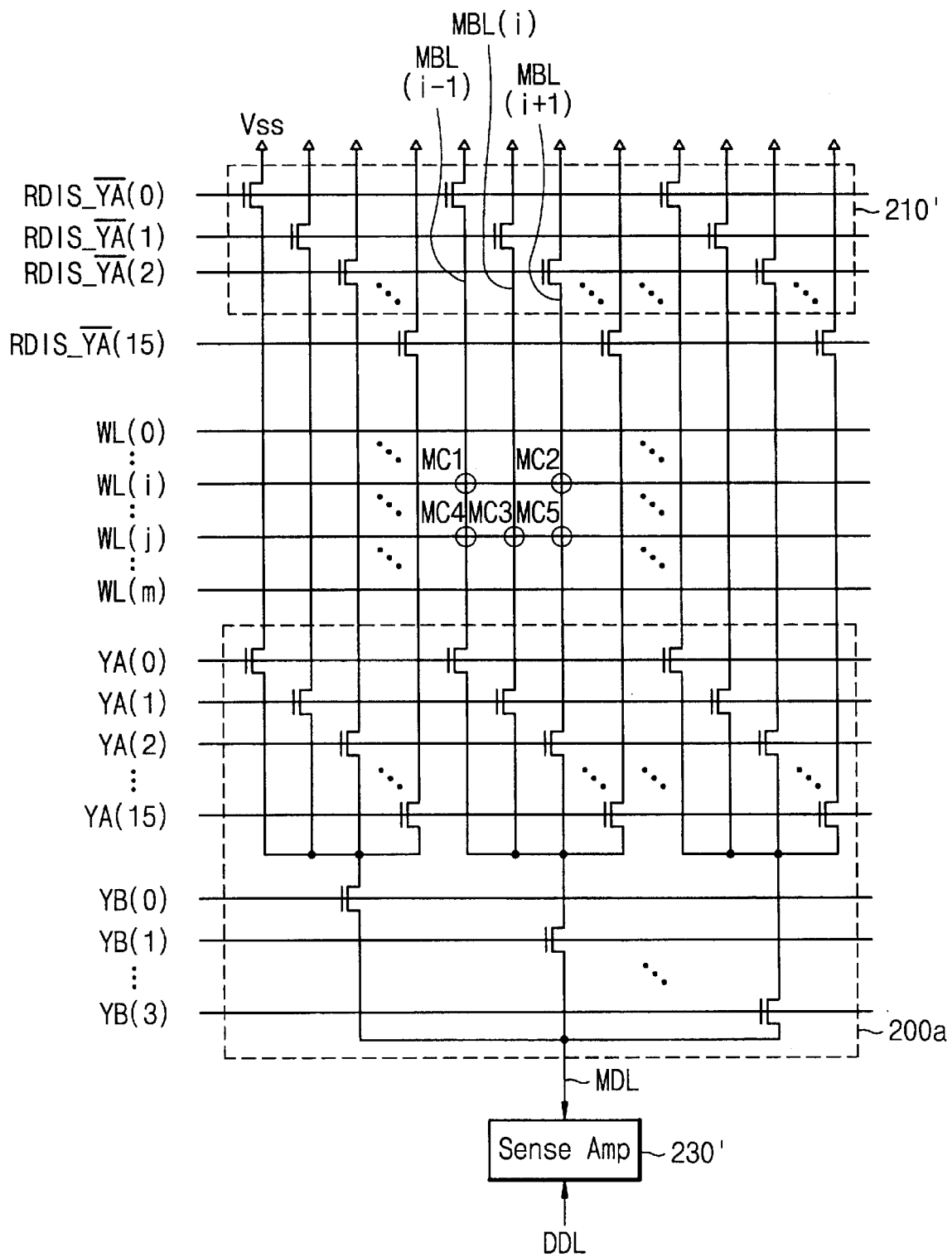
FIG. 7 is a circuit diagram for explaining read operations of the ROM of FIG. 3.
Figure 8:
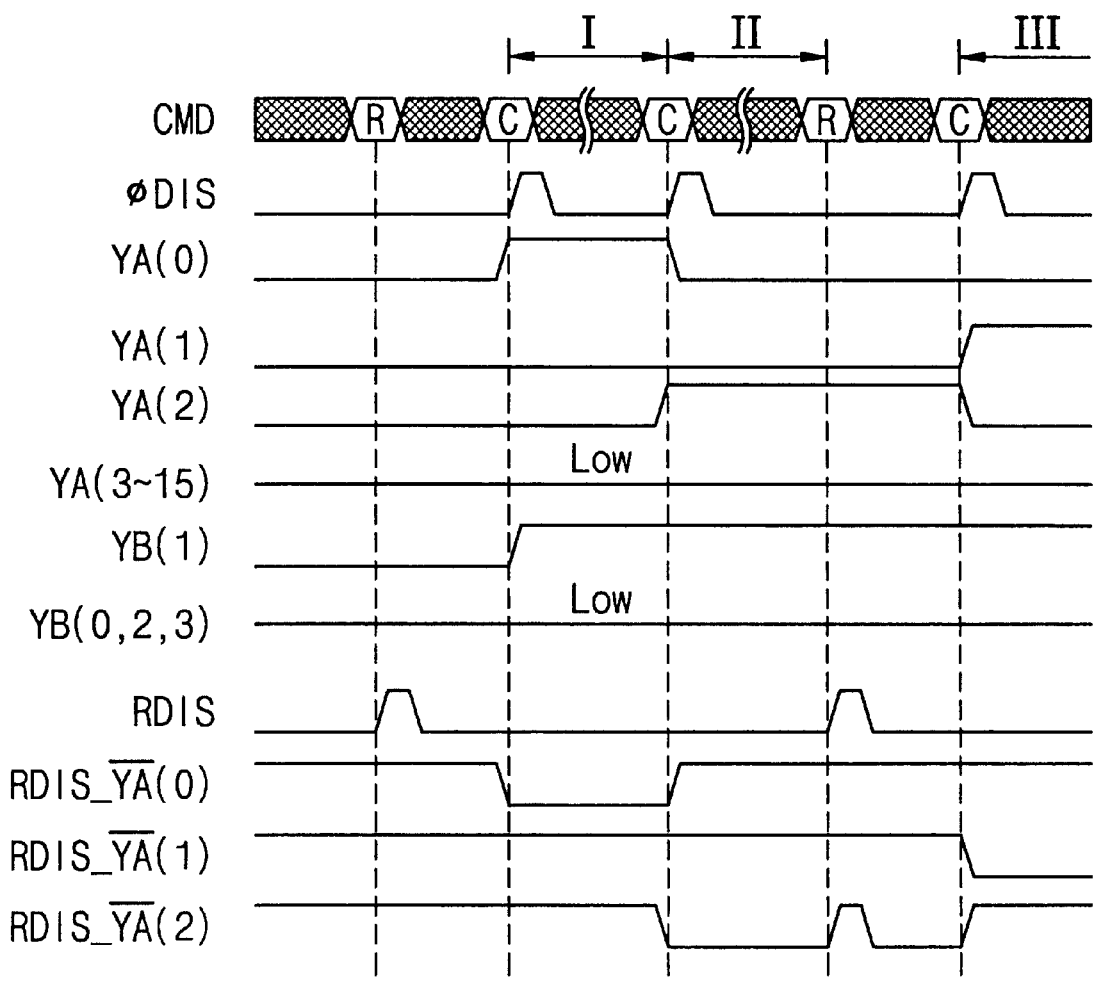
FIG. 8 is a timing diagram for explaining the read operations of the ROM of FIG. 3.

Hereinafter, read operations of the synchronous ROM of FIG. 3 will be described in detail with reference FIGS. 3, 7 and 8. In FIG. 7, the memory cells MC1–MC3 are assumed on-cells and the other cells MC4 and MC5 off-cells. Also, it is assumed that cells MC1 and MC2 are selected in the first burst read operation (i.e., cycles I and II of FIG. 8) and cell MC3 is selected in the second burst read operation (cycle III of FIG. 8). In FIG. 8, reference character CMD represents read commands, R represents a row address applied externally and C represents a column address generated internally.

The first discharge control signal RDIS generated from the discharge control circuit 170 is pulsed actively in synchronism with the row address strobe signal $\overline{\text{RAS}}$ serving as an externally applied read command. The pulse duration is decided to discharge all the main bit lines MBL sufficiently. All the column select signals YA(0)–YA(15) and YB(0)–YB(3) remain at a low level until after an elapse of $\overline{\text{RAS}}$ latency of 2 the first internal column address is generated. Therefore, all the second discharge control signals RDIS_$\overline{\text{YA}}$(0)–RDIS_$\overline{\text{YA}}$(15) are maintained high since the signals RDIS_$\overline{\text{YA}}$(0)–RDIS_$\overline{\text{YA}}$(15) are generated by logically ORing the first discharge signal RDIS and the complementary signals of the second control signals YA(0)–YA(15), thereby all columns of the main bit lines are discharged before the first column address is generated. As a result of this, the capacitive coupling between bit lines during the subsequent data sensing periods can be avoided since all bit lines are discharged prior to the sensing periods.

In cycle I, the column select signals YA(0) and YB(1) become active high in response to the first column address. The discharge control signal RDIS_$\overline{\text{YA}}$(0) goes low but the other signals RDIS_$\overline{\text{YA}}$(1)–RDIS_$\overline{\text{YA}}$(15) remain high. Thus, the capacitive coupling between bit lines during the subsequent data sensing period can be avoided since all unselected main bit lines except the selected bit line MBL (i−1) are discharged prior to the bit line precharge period (see FIG. 6). In addition, the first discharge control signal φDIS is pulsed actively in synchronism with the column address and thus the main data line MDL and the dummy data line DDL are also discharged before the bit line precharging.

In cycle II, the column select signals YA(2) and YB(1) are active high in response to the second column address. The discharge control signal RDIS_$\overline{\text{YA}}$(2) goes low but the other signals RDIS_$\overline{\text{YA}}$(0), RDIS_$\overline{\text{YA}}$(1), RDIS_$\overline{\text{YA}}$(3)–RDIS_$\overline{\text{YA}}$(15) remain high. The capacitive coupling between bit lines can be avoided since all unselected main bit lines except the selected bit line MBL(i+1) are discharged. In addition, the first discharge control signal φDIS is pulsed actively in synchronism with the column address and thus the main data line MDL and the dummy data line DDL are also discharged.

After the cycle II, the first discharge control signal RDIS is pulsed actively again in synchronism with the row address strobe signal $\overline{\text{RAS}}$. Therefore, all columns of the main bit lines are discharged before a next column address is generated. The capacitive coupling between bit lines during the subsequent data sensing periods can be avoided since all bit lines are discharged prior to the sensing periods.

In cycle III, the column select signals YA(1) and YB(1) are active high in response to the third column address. The discharge control signal RDIS_$\overline{\text{YA}}$(1) goes low but the other signals RDIS_$\overline{\text{YA}}$(0), RDIS_$\overline{\text{YA}}$(2)–RDIS_$\overline{\text{YA}}$(15) remain high. As a result, capacitive coupling between bit lines can be avoided since all unselected main bit lines except the selected bit line MBL(i) are discharged. In addition, the first discharge control signal φDIS is pulsed actively in synchronism with the column address and thus the main data line MDL and the dummy data line DDL are also discharged before.

Figure 9:
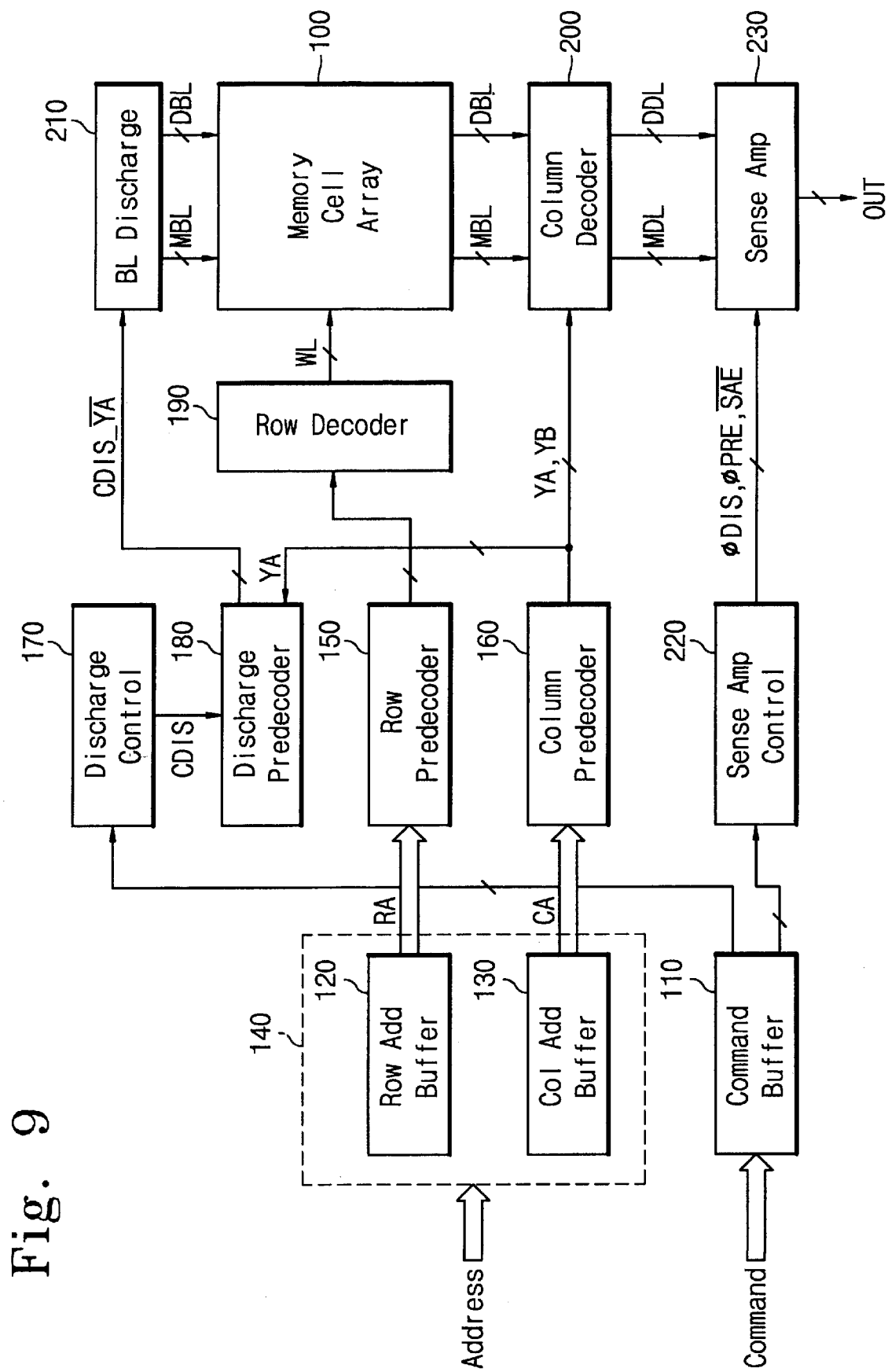
FIG. 9 is a block diagram illustrating another embodiment of a ROM according to the present invention.

Referring to FIG. 9, another embodiment of a synchronous burst mask ROM according to the present invention is illustrated. As shown in FIG. 9, the ROM of this embodiment has the same arrangement as that shown in FIG. 3 except that a discharge control circuit 170' generates a first discharge control signal CDIS in synchronism with the column address strobe signal $\overline{CAS}$ and a discharge predecoder a plurality of second discharge control signals CDIS_$\overline{YA}$ by logically combining the first discharge control signal CDIS with the first column select signals YA from the column predecoder 160. The second discharge control signals CDIS_$\overline{YA}$ are applied to the bit line discharge circuit 210 which selectively discharge the main bit lines MBL in response to the second discharge control signals CDIS_$\overline{YA}$. In FIG. 9, the same parts as those shown in FIG. 3 are represented with like reference numerals and to avoid description duplication, accordingly, their explanation will be omitted.

Like the FIG. 3, it should be noted that the ROM of this embodiment further includes an internal clock buffer circuit, a data latch circuit, a data output buffer, and several burst read control circuits such as a mode register, a burst controller, a burst counter (i.e., an internal column address generator) and a burst address decoder, although not shown. These are well known to those skilled in the art and thus their detailed description will be omitted herein for a concise explanation and in order to avoid unnecessarily obscuring the present invention.

Figure 10:
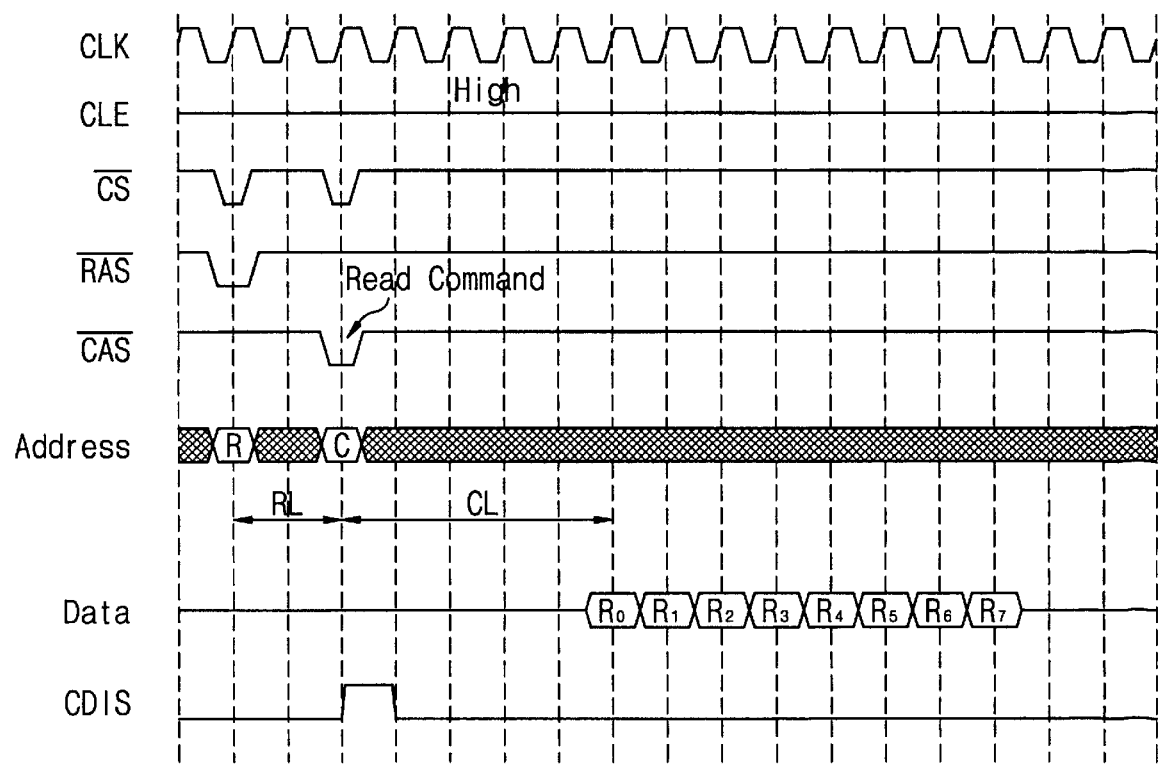
FIG. 10 is a timing diagram for a read operation of the ROM of FIG. 9.

FIG. 10 is a timing diagram for a read operation of the synchronous burst ROM of FIG. 9. Referring to FIG. 10, system clock CLK is effective while a clock enable signal CLE is active high. A chip select signal $\overline{CS}$, a row address strobe signal $\overline{RAS}$ and a column address strobe signal $\overline{CAS}$ are applied to the ROM externally. Row address R is input in synchronism with the chip select signal $\overline{CS}$ and the row address strobe signal $\overline{RAS}$. After a $\overline{RAS}$ latency RL of 2 has been elapsed, the column address C is input in synchronism with the chip select signal $\overline{CS}$ and the column address strobe signal $\overline{CAS}$. The activation of the first discharge control signal CDIS is synchronized with the row address strobe signal $\overline{CAS}$. After a $\overline{CAS}$ latency of 5, data bits R0–R7 are output to exterior via the data latch and data output buffer (not shown).

Figure 11:
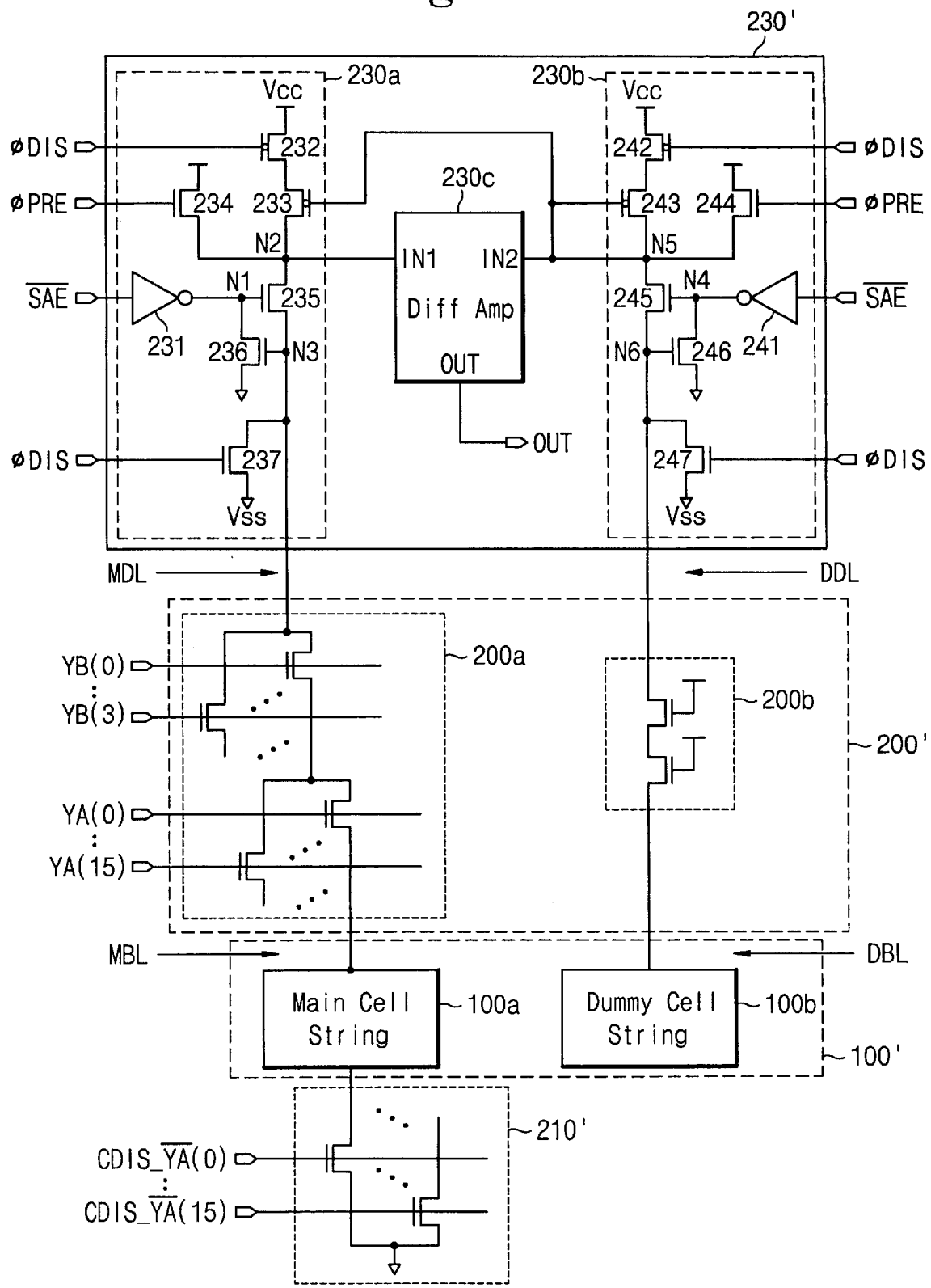
FIG. 11 is a detailed circuit diagram of the memory cell array, column decoder, bit line discharge circuit and sense amplifier shown in FIG. 9.

FIG. 11 is a detailed circuit diagram of the memory cell array 100, column decoder 200, bit line discharge circuit 210 and sense amplifier 230. In this Figure for the simplicity of the illustration, a unit circuit 230' of the sense amplifier 230 and its associated circuits 100', 200' and 210' only are shown. Referring to FIG. 11, the circuits have the same arrangement as those shown in FIG. 5 except that the discharge control signals CDIS_$\overline{YA}$(0)–CDIS_$\overline{YA}$(15), instead of RDIS_$\overline{YA}$(0)–RDIS_$\overline{YA}$(15), are applied to the bit line discharge circuit 210. In FIG. 11, the same parts as those shown in FIG. 5 are represented with like reference numerals and the explanation of their construction and operation will be omitted to avoid description duplication.

Figure 12:
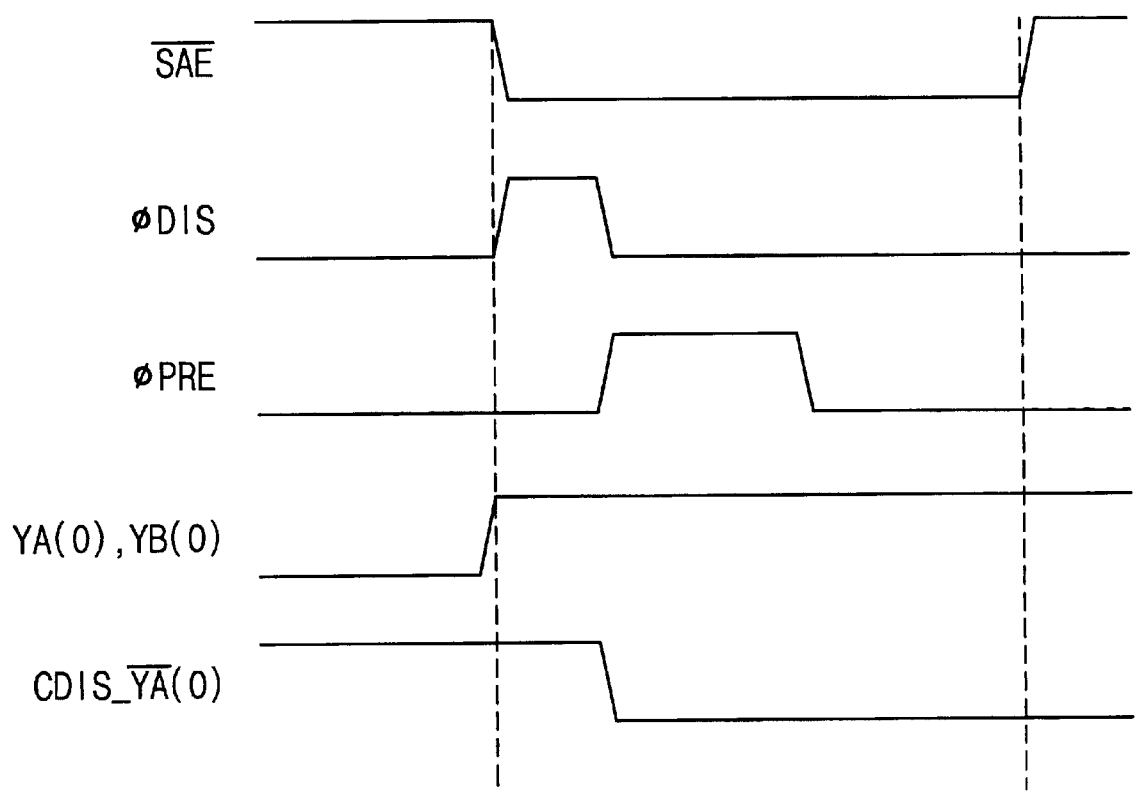
FIG. 12 is a timing diagram of the control signals on the circuits of FIG. 1 1.

FIG. 12 is a timing diagram illustrating the timing relationship between the control signals on the circuits of FIG. 11. With reference to FIGS. 11 and 12, a column of main bit line MBL is selected by activating the column select signals YA(0) and YB(0) in response to an external column address (i.e., an initial column address of burst mode). At this time, the sense amp enable signal $\overline{SAE}$ changes from a logic high level to a logic low level so that the sense amplifier 230' begins to be enabled. At the same time, the discharge control signal φDIS becomes active high, but the mark length (or, pulse duration) of the signal φDIS is maintained only during a given proper time. All the discharge control signals CDIS_$\overline{YA}$(0)–CDIS_$\overline{YA}$(15) remain high until the data line discharging has been completed. After the discharging, the discharge control signal CDIS_$\overline{YA}$(0) goes low while the other discharge control signals CDIS_$\overline{YA}$(1) through CDIS_$\overline{YA}$(15) are maintained high, which will be described in detail later below.

Figure 13:
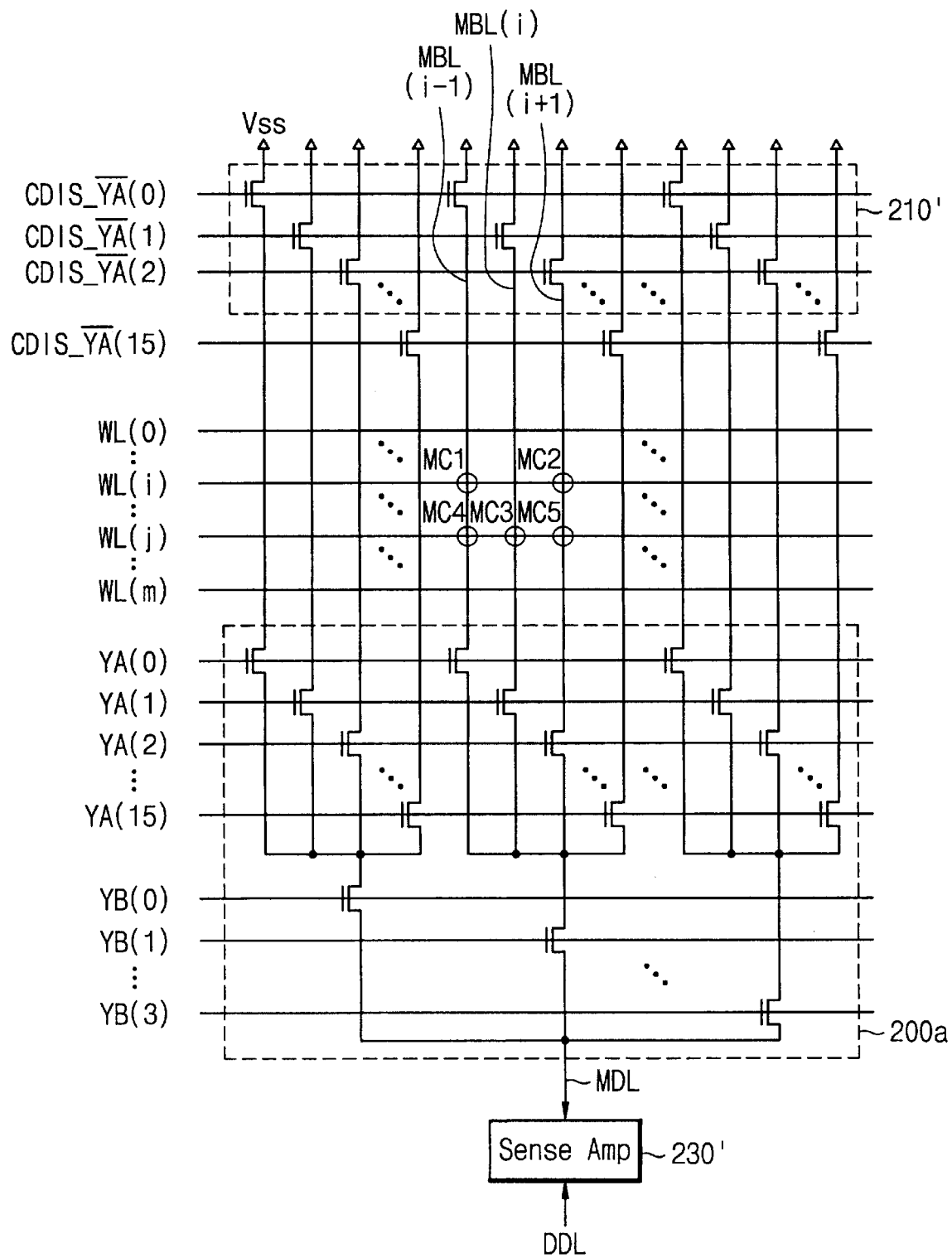
FIG. 13 is a circuit diagram for explaining read operations of the ROM of FIG. 9.
Figure 14:
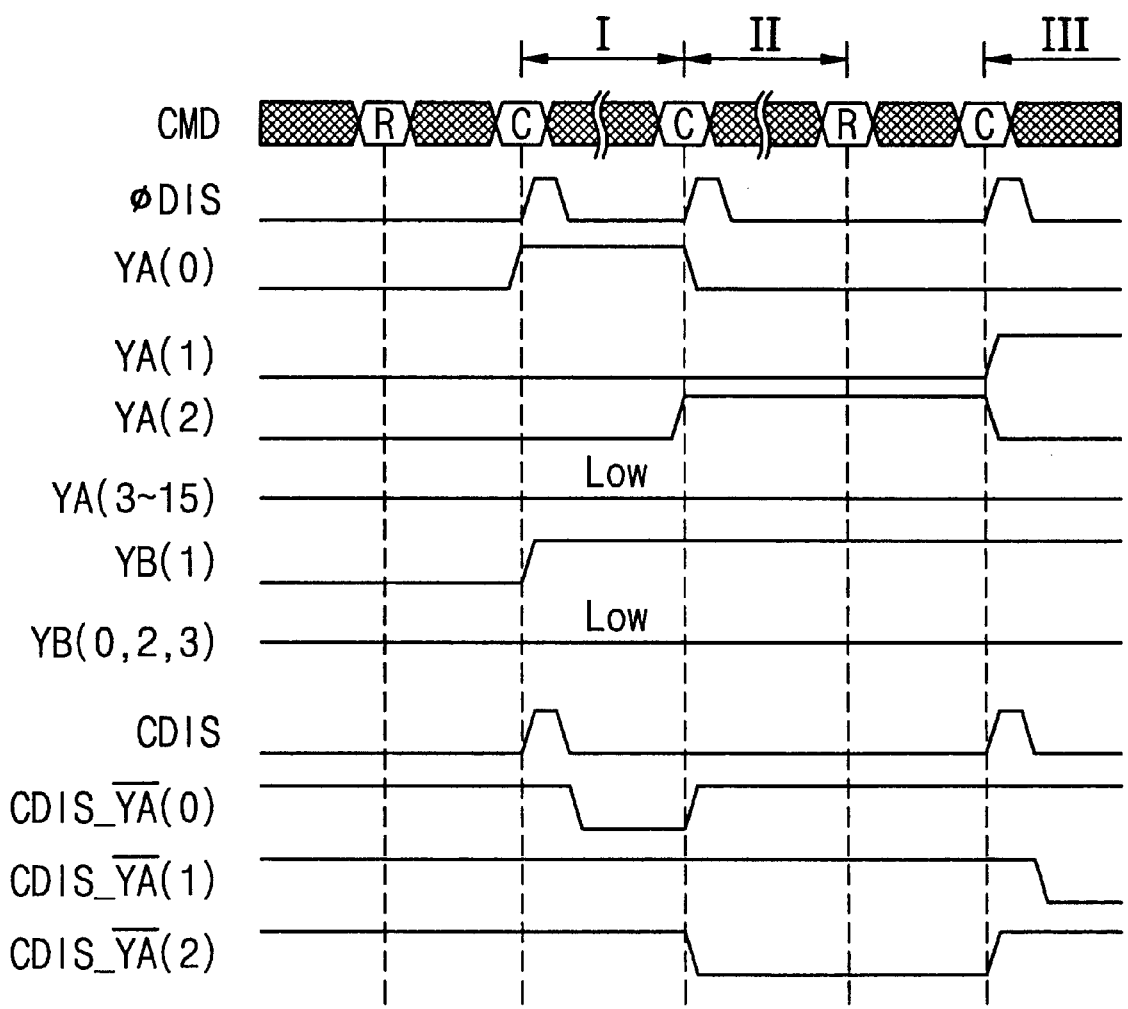
FIG. 14 is a timing diagram for explaining the read operations of the ROM of FIG. 9.

Hereinafter, read operations of the synchronous ROM of FIG. 9 will be described in detail with reference FIGS. 9, 13 and 14. In FIG. 13, the memory cells MC1–MC3 are assumed on-cells and the other cells MC4 and MC5 off-cells. Also, it is assumed that cells MC1 and MC2 are selected in the first burst read operation (i.e., cycles I and II of FIG. 14) and cell MC3 is selected in the second burst read operation (cycle III of FIG. 14). In FIG. 14, reference character CMD represents read commands, R represents a row address applied externally and C represents a column address generated internally.

All the column select signals YA(0)–YA(15) and YB(0)–YB(3) remain at a low level until the first internal column address is generated in cycle 1. Therefore, all the second discharge control signals CDIS_$\overline{YA}$(0)–CDIS_$\overline{YA}$(15) are maintained high since the signals CDIS_$\overline{YA}$(0)–CDIS_$\overline{YA}$(15) are generated by logically ORing the first discharge signal CDIS and the complementary signals of the second control signals YA(0)–YA(15), thereby all columns of the main bit lines are discharged. As a result of this, the capacitive coupling between bit lines during the subsequent data sensing periods can be avoided since all bit lines are discharged prior to the sensing periods.

In cycle I, the first discharge control signal CDIS generated from the discharge control circuit 170 is pulsed actively in synchronism with the column address strobe signal $\overline{CAS}$. The pulse duration is decided to discharge all the main bit lines MBL sufficiently. The column select signals YA(0) and YB(1) become active high in response to the first column address. The discharge control signal CDIS_$\overline{YA}$(0) goes low before the bit line precharge period, but the other signals CDIS_$\overline{YA}$(1)–CDIS_$\overline{YA}$(15) remain high. Thus, the capacitive coupling between bit lines during the subsequent data sensing period can be avoided since all unselected main bit lines except the selected bit line MBL(i−1) are discharged prior to the bit line precharge period (see FIG. 12). In addition, the first discharge control signal φDIS is pulsed actively in synchronism with the column address and thus the main data line MDL and the dummy data line DDL are also discharged before the bit line precharging.

In cycle II, the column select signals YA(2) and YB(1) are active high in response to the second column address. The discharge control signal CDIS_$\overline{YA}$(2) goes low, but the other signals CDIS_$\overline{YA}$(0), CDIS_$\overline{YA}$(1), CDIS_$\overline{YA}$(3)–CDIS_$\overline{YA}$(15) remain high. The capacitive coupling between bit lines can be avoided since all unselected main bit lines except the selected bit line MBL(i+1) are discharged. In addition, the first discharge control signal φDIS is pulsed actively in synchronism with the column address and thus the main data line MDL and the dummy data line DDL are also discharged.

In cycle III, the first discharge control signal CDIS is pulsed actively again in synchronism with the column address strobe signal $\overline{CAS}$. Therefore, all columns of the main bit lines are discharged before the bit line precharging. The capacitive coupling between bit lines during the subsequent data sensing periods can be avoided since all bit lines are discharged prior to the sensing periods. Thereafter, the column select signals YA(1) and YB(1) are active high in response to the third column address. The discharge control signal RDIS_$\overline{YA}$(1) goes low but the other signals RDIS_$\overline{YA}$(0), RDIS_$\overline{YA}$(2)–RDIS_$\overline{YA}$(15) remain high. As a result, capacitive coupling between bit lines can be avoided since all unselected main bit lines except the selected bit line MBL(i) are discharged. In addition, the first discharge control signal φDIS is pulsed actively in synchronism with the column address and thus the main data line MDL and the dummy data line DDL are also discharged.

As described above, according to the present invention, ROMs are free from bit line coupling due to the selection of particular memory cells, the cell selection sequence and the programmed states of the selected cells, leading to an improvement in read speed.

Although the present invention and its advantages have been described in detail, it should be understood that various changes, substitutions and alterations can be made herein without departing from the spirit and scope of the invention as defined by the appended claims.

What is claimed is:

1. A read-only memory device being applied with a row address and a column address which are synchronized to a row address strobe signal and a column address strobe signal, respectively, the memory device comprising:
   an array (100) of a plurality of memory cells arranged in rows and columns;
   means (130, 160) for generating a plurality of column select signals (YA) in response to the column address;
   means (200) for selecting one of the columns in response to the column select signals;
   means (110, 170; or 110, 170') for generating a first discharge control signal (RDIS, or CDIS) in response to an externally applied command;
   means (180 or 180') for generating a plurality of second discharge control signals (RDIS_$\overline{YA}$, or CDIS_$\overline{YA}$) by logically combining the first discharge control signal with the column select signals; and
   means (210) for selectively discharging the columns in response to the second discharge control signals.

2. The memory device according to claim 1, wherein the command is represented by a logical combination of an externally applied chip select signal and the row and column address strobe signals.

3. The memory device according to claim 2, wherein the first discharge control signal is activated in synchronism with the row address strobe signal before a column precharge operation.

4. The memory device according to claim 3, wherein the second discharge control signals all are activated in response to the first discharge control signal such that all the columns are discharged.

5. The memory device according to claim 4, wherein the second discharge control signals are generated by logically ORing the first discharge signal and a complement of the second control signals so that unselected ones of the columns are discharged.

6. The memory device according to claim 2, wherein the first discharge control signal is activated in synchronism with the column address strobe signal before a column precharge operation.

7. The memory device according to claim 6, wherein the second discharge control signals all are activated in response to the first discharge control signal such that all the columns are discharged.

8. The memory device according to claim 1, wherein the command is a read command.

9. A mask read-only memory device being externally applied with a row address and a column address synchronized with row and column address strobe signals, respectively, and generating a plurality of internal column addresses sequentially in response to the externally applied column address, the memory device comprising:
   an array (100) of a plurality of memory cells coupled to word lines and bit lines;
   a column predecoder (160) for generating a plurality of first column select signals (YA) and a plurality of second column select signals (YB) in response to the external column address;
   a column decoder (200) for selecting one of the bit lines in response to the first column select signals and coupling the selected bit line to a data line in response to the second column select signals;
   a sense amplifier (230) for sensing and amplifying a data bit on the data line;
   a discharge control circuit (170, or 170') for generating a first discharge control signal (RDIS, or CDIS) in response to an externally applied command;
   a discharge predecoder (180 or 180') for generating a plurality of second discharge control signals (RDIS_$\overline{YA}$, or CDIS_$\overline{YA}$) by logically combining the first discharge control signal with the first column select signals; and
   a bit line discharge circuit (210) for selectively discharging the bit lines in response to the second discharge control signals before a bit line precharge operation.

10. The memory device according to claim 9, wherein the memory device is a NAND type memory.

11. The memory device according to claim 10, wherein the command is represented by a logical combination of an externally applied chip select signal and the row and column address strobe signals.

12. The memory device according to claim 11, wherein the command is a read command.

13. The memory device according to claim 12, wherein the first discharge control signal is activated in synchronism with the row address strobe signal.

14. The memory device according to claim 13, wherein the second discharge control signals are generated by logically ORing the first discharge signal and a complement of the second control signals so that unselected ones of the bit lines are discharged.

15. The memory device according to claim 12, wherein the first discharge control signal is activated in synchronism with the column address strobe signal.

16. The memory device according to claim 12, further comprising means (220) for generating a third discharge control signal (φDIS) in response to the command and means (237) for discharging the data line in response to the third discharge control signal.

17. The memory device according to claim 16, wherein the third discharge control signal is activated in synchronism with the internal column addresses.

18. The memory device according to claim 17, further comprising at least one dummy cell, a dummy data line coupled to the at least one dummy cell, and means for discharging the dummy data line in response to the third discharge control signal.

19. A method for reading data out of a NAND type mask read-only memory device, the memory device having a plurality of memory cells coupled to a corresponding one of word lines and to a corresponding one of bit lines, being externally applied with a row address and a column address in synchronism with a row address strobe signal and a column address strobe signal, respectively, and generating a plurality of internal column addresses in response to the externally applied column address, the method comprising steps of:

discharging all of the bit lines in synchronism with the row address strobe signal;

precharging a selected one of the bit lines; and sensing a data bit on the selected bit line.

20. The method according to claim 19, further comprising a step of discharging unselected bit lines in synchronism with one of the internal column addresses between the discharging and precharging steps.

* * * * *